US 7,439,180 B2

(12) United States Patent
Guha et al.

(10) Patent No.: US 7,439,180 B2
(45) Date of Patent: Oct. 21, 2008

(54) DISPENSER SYSTEM FOR ATOMIC BEAM ASSISTED METAL ORGANIC CHEMICAL VAPOR DEPOSITION (MOCVD)

(75) Inventors: Supratik Guha, Chappaqua, NY (US); Fenton R. McFeely, Ossining, NY (US); John J. Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 11/495,335

(22) Filed: Jul. 28, 2006

(65) Prior Publication Data

US 2008/0026575 A1    Jan. 31, 2008

(51) Int. Cl.
*H01L 21/44* (2006.01)

(52) U.S. Cl. .............................. 438/681; 427/255.394; 118/715

(58) Field of Classification Search ................. 438/681; 118/723 CB, 723 FI; 427/255.23, 255.28, 427/255.394
See application file for complete search history.

(56) References Cited

U.S. PATENT DOCUMENTS 5,741,547 A *  4/1998  Akram et al. .......... 427/255.392
6,596,133 B1 *  7/2003  Moslehi et al. ........ 204/192.17

* cited by examiner

*Primary Examiner*—Charles D. Garber
*Assistant Examiner*—Reema Patel
(74) *Attorney, Agent, or Firm*—Scully, Scott, Murphy & Presser, P.C.; Ido Tuchman, Esq.

(57) ABSTRACT

A dispenser system for use in atomic beam assisted metal organic chemical vapor deposition is provided as well as a method of depositing an ultra-thin film using the same. The inventive dispenser system includes an atomic source having an unimpeded line of site to a substrate and an annular metal organic chemical vapor deposition showerhead having a plurality of nozzles for delivering a precursor to the substrate. In accordance with the present invention, each of the nozzles present on the showerhead is angled to provide precursor beam trajectories that crossover and are non-intercepting.

20 Claims, 2 Drawing Sheets

DISPENSER SYSTEM FOR ATOMIC BEAM ASSISTED METAL ORGANIC CHEMICAL VAPOR DEPOSITION (MOCVD)

FIELD OF THE INVENTION

The present invention relates to the deposition of ultra-thin films having a thickness of less than 1 nm and more particularly to a dispenser system for deposition of such ultra-thin films using atomic beam assisted metal organic chemical vapor deposition. The dispenser system employed in the present invention is capable of depositing an ultra-thin film such that the thickness variation of the as-deposited ultra-thin film across a deposited surface is less than 1.0 Å (1 sigma, RMS).

BACKGROUND OF THE INVENTION

In the fabrication of complementary metal oxide semiconductor (CMOS) gate stacks involving high dielectric constant (i.e., k greater than about 4.0, more typically greater than 7.0) dielectrics, ultra-thin (on of the order of less than 1 nm) metal nitride capping layers have been shown to be of considerable utility. In order to use the metal nitride capping layers in manufacturing, it is necessary to devise a method that allows the deposition of such capping layers. Because of the thinness of such capping layers, and their proximity to a particularly delicate part of the device, e.g., the gate insulator, the requirements and constraints on the requisite deposition process are somewhat different than are normally encountered in the deposition of thin films for microelectronic applications.

Because of the thinness of the capping layers, the deposition rate is typically not an important issue. However, for the same reason, uniformity is of particular importance. The proximity to the gate insulator makes the impurity concentration in the films (e.g., C impurities) of particular concern from a chemical point of view, over and above their effect upon resistivity. In addition, it is generally desirable to perform the deposition at as low a temperature (typically less than 400° C.) as possible, in order to mitigate undesirable diffusion and/or solid-state reactions within the substrate.

Because of these requirements, all of the prior art methods commonly used to deposit binary compound films such as metal nitrides may have significant drawbacks. For example, sputter deposition methods are generally undesirable in this application because of the danger of physical damage to the underlying gate insulator. Chemical vapor deposition (CVD) however appears to be a promising method. In CVD, numerous organometallic precursors (such as carbonyls, alkyls, etc) with reasonable vapor pressure exist for a large number of candidate metals. The problem to be faced with conventional CVD methods is in performing the deposition at sufficiently low temperature (less than about 400° C.).

Even if the metal containing precursor can be thermally decomposed cleanly at sufficiently low temperatures, the most common molecular source of nitrogen, $NH_3$, may require excessively high substrate temperatures to effect the transformation into a metal nitride.

One obvious way around the aforementioned problem of high substrate temperature is to use a plasma assisted (or enhanced) CVD process. In a typical plasma assisted CVD process, the organometallic precursor and the nitrogen source would be constituents of a plasma discharge to which the substrate would be exposed. Unfortunately, such an approach would generally run afoul of the requirement for film purity since a plasma is simply too reactive towards the organic ligands of the metal precursor. In addition to metal and reactive nitrogen species, reactive ligand fragments would also be incident upon the substrate, leading to undesirable carbon incorporation.

A more sophisticated deposition method which frequently makes use of plasma-excited species is atomic layer deposition (ALD). Atomic layer deposition of metal nitrides is a two-step process in which the metal precursor is first chemisorbed to saturation coverage on the substrate, the ligands associated with the metal precursor are then "reacted away" and thereafter nitride film is formed by the exposure to reactive nitrogen atoms from a plasma source. Cycles of these two steps are successively performed until the desired film thickness is obtained.

At first glance, the ALD method seems exceedingly promising. In the ideal case described above, uniformity is virtually guaranteed by the chemical nature of the ALD process. However, ALD does impose the additional requirement of finding a precursor that chemisorbs to saturation, both on the initial substrate and upon the growing film, which typically are rather different chemical entities. More importantly, the ALD approach is also potentially subject to purity concerns. That is, metal precursor molecules typically chemisorb to saturation because they cannot shed all of their ligands. Since these ligands are not shed thermally by the precursor on the substrate surface, the ligands are vulnerable to over-aggressive attack by the plasma species resulting in the same purity concerns as in the case of ordinary plasma assisted CVD.

To illustrate how these process requirements affect the deposition methodology, a specific case of a metal nitride capping layer deposition is now mentioned. In particular, the deposition of 1-2 nm layers of aluminum nitride (AlN) is now mentioned. In common with many metal nitride systems, the preferred chemical precursors for Al are organometallic species, specifically trialkyl compounds, or amine adducts of alane, although the latter are less readily available. Focusing on the metal alkyl precursors, the difficulties associated with each of the potential deposition schemes outlined above is now described.

The metal alkyl precursors, especially tris(tertbutyl)aluminum, can be employed to deposit reasonable pure aluminum at moderate temperatures, but reaction with ammonia to form a stoichiometric metal nitride is only efficient at temperatures in excess of 400° C., which restricts the potential applications of such a process. In addition, the extremely high reactivity of the alkyl aluminum precursor with the substrate at these temperatures would render thickness and uniformity control difficult.

Plasma deposition is completely ruled out on purity grounds alone. ALD might seem to be a promising approach, but it is also inapplicable. If the substrate is sufficiently hot, on the order of 250° C. or greater, the alkyl aluminum precursor used in an ALD process spontaneously decomposes on the substrate, shedding all of its ligands, to leave behind pure Al which could be nitrided by a plasma generated species. However, this decomposition process is not self-limiting at a coverage of less than or equal to one monolayer. This self-limiting behavior is an absolute precondition for ALD. If one were to drop the substrate temperature to a point where the alkyl aluminum did not completely decompose, it might be possible to achieve self-limiting chemisorption, however if this were exposed to plasma generated species one would have the same purity concerns that are typically associated with ordinary plasma assisted CVD. That is, the organic ligands on the substrate surface would be subject to decomposition by reactive plasma species, which could lead to carbon incorporation into the film.

By process of elimination, one is thus led to the preferred method for the low temperature deposition of ultra-thin metal nitride films, atomic assisted MOCVD. In this process, the substrate temperature can be maintained sufficiently high to ensure complete clean decomposition of the alkyl aluminum precursor on the substrate, while simultaneously exposing the substrate to highly reactive nitrogen atoms generated in an atom source. The nitrogen flux should be in sufficient excess over the alkyl aluminum flux to ensure that a stoichiometric (maximally nitrided) film is produced. Furthermore, it is important that this nitrogen atom flux be directed at the substrate simultaneously with the alkyl aluminum flux.

Metal nitrides are good diffusion barriers. If the organometallic and atom fluxes were applied sequentially buried aluminum atoms might go unreacted, leading to non-stiochiometric films. To avoid the problem of gas phase reaction between the alkyl aluminum species and the nitrogen atoms, which could lead to alkyl ligand fragments impinging on the growth surface and incorporating carbon, the pressure in the reactor is kept quite low during deposition, preferably below 1 mtorr and most preferably below 0.1 mtorr. At these pressures, gas phase chemistry is suppressed to negligible levels.

In most CVD applications, such low pressures would be quite impractical, as they would lead to unacceptably low deposition rates, however since there is an ongoing desire in growing films of less than 1 nm thickness, even a deposition rate of 0.1 nm/min would be acceptable. This low total pressure requirement does however necessitate that the nitrogen atoms be remotely generated with effective differential pumping with respect to the deposition chamber.

The primary challenge in employing the preferred method is to achieve film uniformity and maintain proper stoichiometry across the film. A standard apparatus for achieving uniformity in MOCVD is the "showerhead" apparatus shown in FIG. 1. In FIG. 1, the showerhead/substrate/heater assembly is placed within a vacuum enclosure 7. The gas comprising the organometallic precursor is introduced into the cavity of the showerhead 3 by means of valve 1 and introduction tube 2. From there the precursor gas is sprayed onto the substrate via a series of nozzles 4, typically a few hundred in number and on the order of 1 mm in diameter, onto the substrate 5, which is situated atop the substrate heater 6. A large number of nozzles 4 and a close proximity of the substrate 5 to the showerhead 3 (typically at most 1 cm) are employed to ensure a uniform thickness across the substrate. For this to be achieved, it is also necessary to establish a substantial pressure differential between the showerhead cavity and the interior of the vacuum enclosure 7 during the deposition. This is to ensure that the showerhead cavity becomes uniformly filled with precursor gas so that each nozzle conveys the same amount of precursor gas to the substrate. Naturally with some specific designs there can be some modest deviations from the idea situation just described.

Such a prior art apparatus would do an excellent job of delivering trialkyl aluminum precursors to the substrate in a uniform fashion, but it renders the problem of delivering nitrogen atoms to the growth surface all but insoluble. The nitrogen atoms cannot be introduced through a valve and tube into the showerhead cavity. Nitrogen atoms will react with and/or recombine very efficiently on any surfaces they encounter. Any nitrogen atoms introduced through such as valve 1 would likely experience thousands of encounters with the cavity walls before escaping through the nozzles 4. Thus, few if any reactive atoms would reach the substrate. Furthermore, due to the higher pressure within the showerhead cavity, deleterious gas phase chemical interactions between the atoms and the metal precursor molecules could take place.

One could attempt to bring the nitrogen atoms in from the side, but the approximate 15:1 ratio of the substrate radius to the showerhead spacing would also lead to depletion problems. In addition, the loss of cylindrical symmetry could lead to azimuthal stoichiometry variations, which could only be overcome, if at all, by the use of multiple costly atom sources.

The design challenge, therefore, for this process and for atomic beam assisted MOCVD generally, is to produce an applicator system which efficiently transports both the organometallic metal precursor and the atomic beam to the substrate, in such a fashion that uniformly thick films across a substrate can be grown. The requirements for uniform flux arriving at the substrate surface are quite different for the atomic beam and the MOCVD precursor. Since the atomic beam and the nitrogen atoms constitute a reagent in excess, it is not necessary to have uniform flux across the surface. It is sufficient simply to ensure that it is everywhere in excess, as beyond that point the nitrogen atoms will merely recombine on the surface to yield nonreactive nitrogen molecules.

The MOCVD precursor flux must be extremely uniform across the entire substrate, as it is this reagent which determines the film thickness. A $1\sigma$ non-uniformity of better than 10% is virtually always required, and better than 5% is preferred.

In view of the above, there is a continued need to provide a new and improved atomic beam assisted metal organic chemical vapor deposition process which is capable of providing highly pure ultra-thin films in which the thickness variation of the as deposited film across the deposited surface is less than 1 Å.

SUMMARY OF THE INVENTION

The present invention provides a dispenser system for use in atomic beam assisted metal organic chemical vapor deposition as well as a method of depositing an ultra-thin film using the same.

In one embodiment of the present invention, the inventive dispenser system includes an atomic source having an unimpeded line of site to a substrate, and an annular metal organic chemical vapor deposition showerhead having a plurality of nozzles for delivering a precursor to the substrate. In accordance with the present invention, each of the nozzles present on the showerhead is angled to provide precursor beam trajectories that crossover and are non-intercepting.

The phrase "crossover and non-intercepting" is used in the present invention to denote that the precursor beam trajectories from each of the nozzles present on the annular showerhead satisfy the following two conditions: 1) A non-diverging beam of precursor emitted from the showerhead nozzle would fail to intersect the substrate wafer at all; and 2) The point of closest approach of such a beam to the substrate would lie on the opposite side of the substrate from the nozzle. For example, and if a nozzle were located at the North compass point, the point on the substrate at which a non-diverging beam would approach most closely would lie on the South half of the substrate. In the preferred embodiment described below, the point of closest approach would be at due South.

In yet another embodiment of the present invention, the dispenser system includes an atomic source having an unimpeded line of site to a substrate, said atomic source generates reactive nitrogen atoms; and an annular metal organic chemical vapor deposition showerhead having a plurality of nozzles for delivering an organo aluminum precursor to the substrate, wherein each of said nozzles is angled to provide precursor beam trajectories that crossover and are non-intercepting.

The present invention also provides a method of depositing an ultra-thin film (thickness of less than 1 nm) on a surface of a substrate such that the deposited film has high purity and is highly uniform. The term "high purity" and "highly uniform" are defined later in the present application.

In accordance with the inventive method, a substrate is provided to a vacuum enclosure of an atomic beam assisted metal organic CVD apparatus which further includes an atomic source having an unimpeded line of site to a substrate and an annular metal organic chemical vapor deposition showerhead having a plurality of nozzles for delivering a precursor to the substrate, wherein each of said nozzles is angled to provide precursor beam trajectories that crossover and are non-intercepting. Next, an ultra-thin film is deposited on a surface of the substrate from the precursor and highly reactive atoms that are generated from the atomic source.

DETAILED DESCRIPTION OF THE INVENTION

The present invention, which provides a dispenser system for the atomic beam assisted metal organic chemical vapor deposition of highly pure and uniform ultra-thin films, will now be described in greater detail by referring to the following discussion and FIG. 2 which accompanies the present application.

As stated above, the present invention provides a dispenser system for atomic beam assisted metal organic chemical vapor deposition which permits the deposition of ultra-thin films such as, for example, metal nitrides, that have a high purity and uniformity. By "high purity" it is meant, that the total bulk film impurity level should be less than 2%. By "high uniformity" it is meant that the deposited films have a thickness variation across the deposited surface of less than 1 Å (1 sigma RMS on an ultra-thin film). By "ultra-thin" it is meant that the inventive films have an as-deposited thickness of less than 1 nm.

It is noted that the present invention can be used in fabricating any type of dielectric and/or conductive film that can be fabricating using atomic beam assisted metal organic chemical vapor deposition. In such a deposition process, organometallic precursors are typically used as the metallic source. Highly reactive atoms such as nitrogen that are capable of combining with the metallic species of the precursor are also employed as the atomic source.

In a preferred embodiment of the present invention, the film deposited is a metal nitride such as an aluminum nitride in which the Al source is an alkyl aluminum precursor and the atom source is N that is derived from $N_2$ or $NH_3$.

Figure 2:
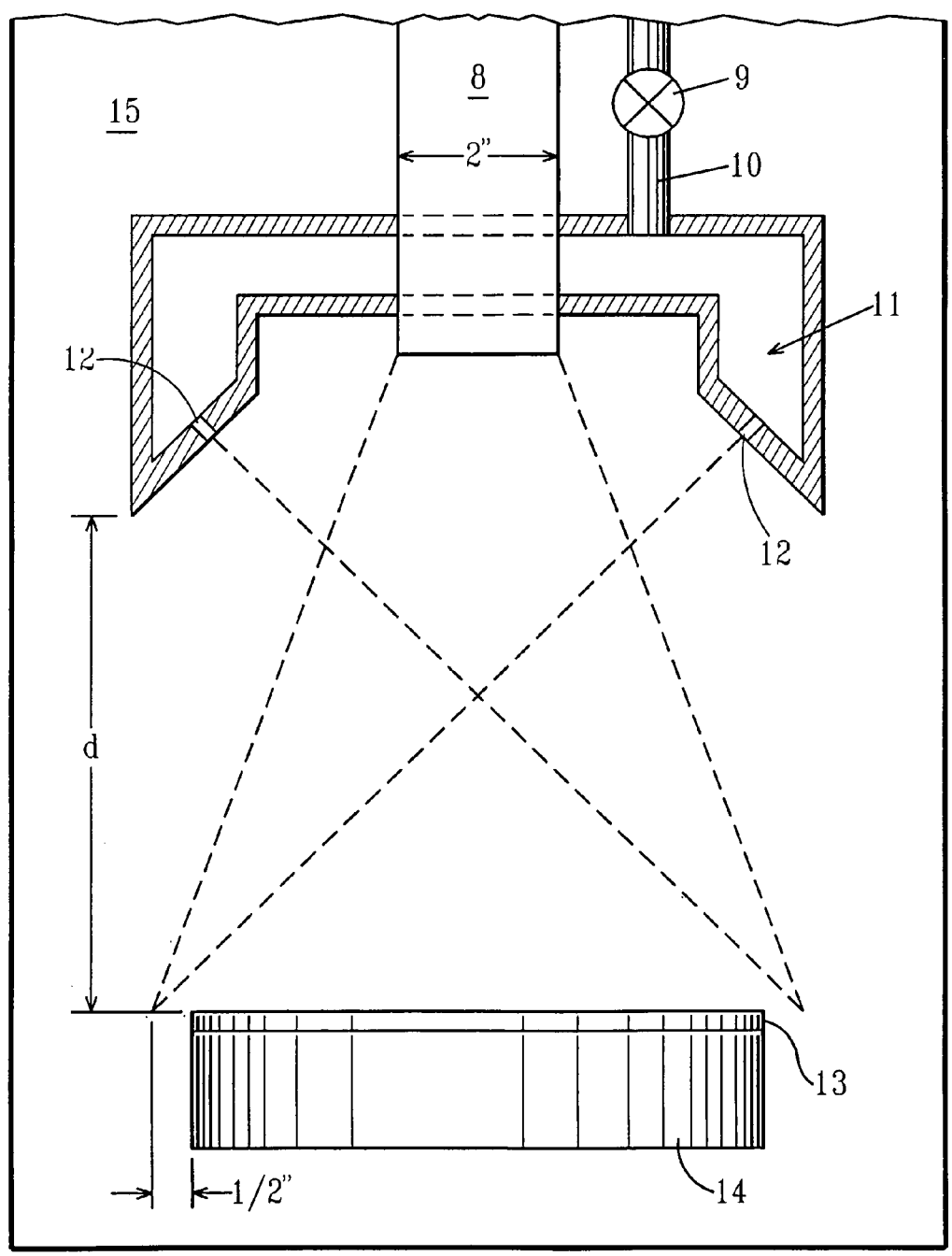
FIG. 2 is a schematic of the inventive dispenser system for an atomic beam assisted metal organic chemical vapor deposition apparatus.

Reference is now made to FIG. 2, which illustrates the dispenser system that is employed in the present application for atomic beam assisted metal organic chemical vapor deposition. An atom source 8 is placed in a vacuum enclosure 15. The distance, d, from the end of the atom source 8 to a substrate 13 is generally from about 20 to about 40 cm, with a distance from about 25 to about 35 cm being more preferred. The path from the end of the atom source 8 to the substrate 13 is unobstructed, eliminating any problems of recombination. That is, the atom source employed in the present invention has an unimpeded line of sight to the substrate.

Although the initial atomic beam diameter is typically only on the order of 2", the natural divergence of the beam in its distance traveled to the substrate is such that the difference of atom flux from the substrate center to the substrate edge is only about a factor of 1.5. This is sufficiently uniform to easily meet the "reagent everywhere in excess" criterion.

The real design problem for atomic beam assisted metal organic chemical vapor deposition is the delivery of a uniform precursor flux. The method involved in the prior art, shown in FIG. 1, utilizes hundreds of nozzles in close proximity to direct the precursor onto the surface with sufficient uniformity. The need for an unobstructed path from the atomic beam source to the substrate precludes the use of this approach, but this problem has been solved with the apparatus shown in FIG. 2. The precursor is admitted into the cavity of an annular showerhead 11 by means of valves 9 and inlet tubes 10. A total of 4 such valve/tube combinations is typically used to mitigate the loss of cylindrical symmetry necessitated by the central positioning of the atomic beam source. The key to the success of the inventive design is the angle of the nozzles 12 (typically 36 nozzles are present, but neither the invention nor the embodiment is limited to the aforementioned number of nozzles), which define the nominal trajectories of the MOCVD precursor beams directed towards the substrate. In accordance with the present invention, each of the nozzles present on the showerhead is angled to have nominal beam trajectories that crossover and are non-intercepting. An MOCVD precursor molecule emitted from a nozzle 12 and traveling exactly along the nozzle axis will actually miss an 8" diameter substrate on the opposite side by about 0.5". It is only by virtue of the beam divergence that precursor molecules are able to impinge on the substrate. (See the dashed lines in FIG. 2). In FIG. 2, reference numeral 14 denotes a substrate heater or holder.

The conditions used for depositing the ultra-thin film using the inventive dispenser system described above are variable and are well known to those skilled in the art of deposition using atomic beam assisted MOCVD. Typically, the substrate is maintained at a substrate temperature of 250° C., with a substrate temperature from about 150° to about 350° C. being even more typical. The concentration of atomic source employed is generally in excess of that of the precursor to ensure that a stoichiometric film is produced. The partial pressure of organometallic precursor is typically maintained in the range of 0.01 to 0.5 mtorr; the remainder of the total pressure (less than 1 mtorr and more preferably below 0.1 mtorr) is made up of nitrogen from the atom source.

It should be understood that these figures are meant to be approximate and illustrative only, as the exact values employed would depend on the totality of the conditions prevailing in the reactor. For instance, they would be dependent upon the exact temperature selected for the substrate as this would affect the reactivity of the organometallic precursor. In a practical application, the organometallic and nitrogen atom partial pressures would be optimized empirically to values, which in most cases would resemble those given above. It is noted for completeness that for the successful growth of high purity metal nitrides it is necessary that gases comprising oxygen be rigorously excluded from the interior of the vacuum enclosure 15. Thus, the base pressure of said vacuum enclosure should be less than $10^{-6}$ torr and more preferably less than $10^{-8}$ torr. This requirement would be well known to one versed in the art of thin film metal nitride deposition.

Figure 1:
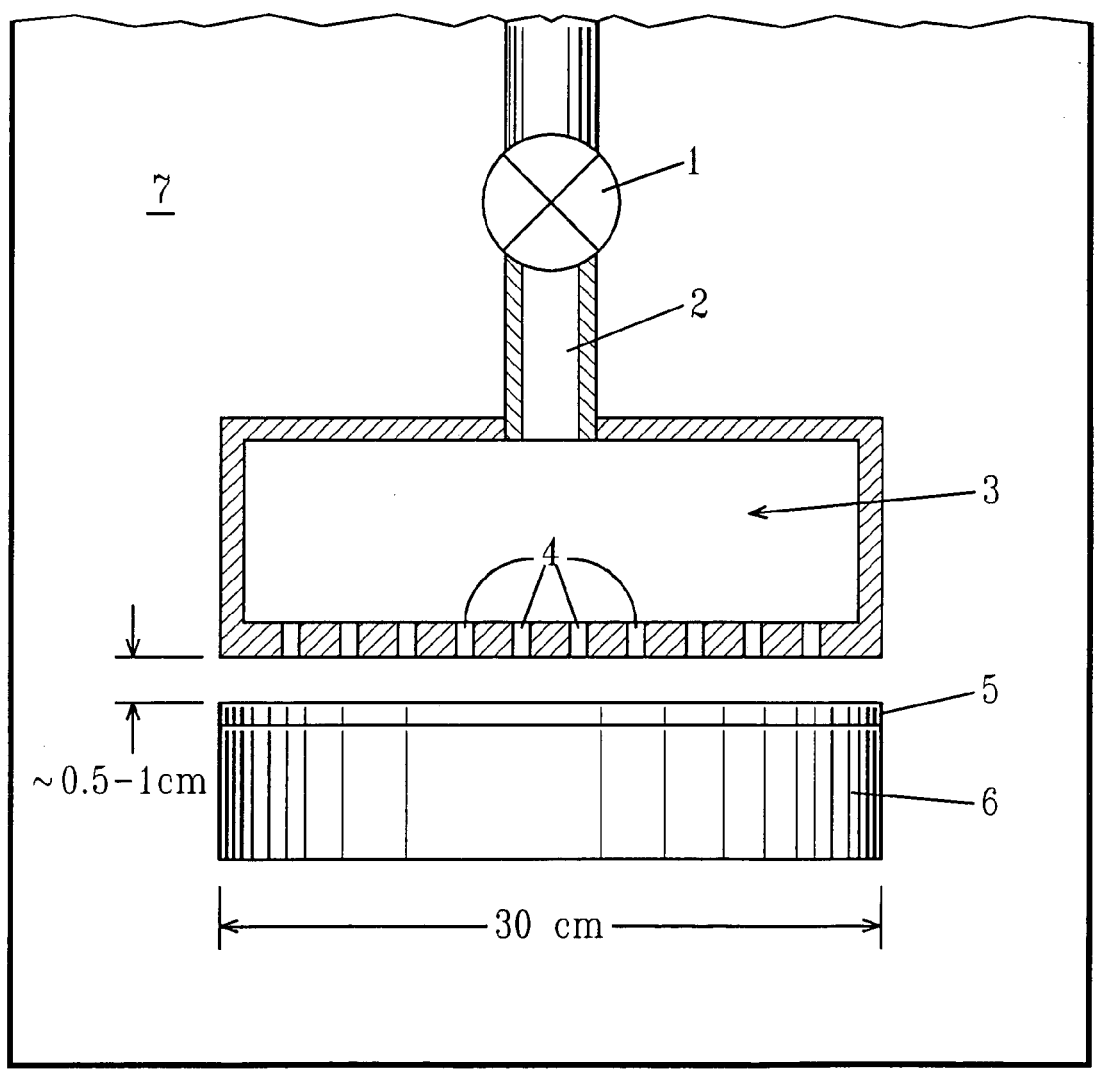
FIG. 1 is a schematic of a prior art dispenser system for an atomic beam assisted metal organic chemical vapor deposition apparatus.

The performance of the annular showerhead 11 shown in FIG. 2 was determined by Monte Carlo trajectory calculations. Such calculations have been used in the past by the applicants and have been found to give accurate results for prior art showerheads as depicted in FIG. 1. To test a design typically 100,000 trajectories were calculated, using a Monte Carlo method to select the nozzle from which the molecule was admitted and the radial and azimuthal deviations of its trajectory from the nozzle axis, simulating the angular distribution of the beam emitted from the nozzle. This angular distribution was taken to be of the form $f(\theta,\phi)=\cos^n\theta$, where theta and phi refer respectively to the polar angle of inclination from the cylindrical axis of symmetry of the nozzle in question and the azimuthal angle about the same axis.

The parameter n was allowed to vary between ¼ and 10, with attention being focused on values of n between ½ and 2, the most realistic cases. With designs involving nominal trajectories which intercepted the substrate, the applicants were not able to achieve satisfactory uniformity, with deviations in excess of 20% being unavoidable. With the non-intercepting crossover trajectory approach described above and illustrated in FIG. 2, the applicants were able to achieve a theoretical uniformity of better than 5%.

While the present invention has been particularly shown and described with respect to preferred embodiments thereof, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A dispenser system for use in atomic beam assisted metal organic chemical vapor deposition comprising:
    an atomic source having an unimpeded line of site to a substrate; and
    an annular metal organic chemical vapor deposition showerhead having a plurality of nozzles for delivering a precursor to the substrate, wherein each of said nozzles is angled to provide precursor beam trajectories that crossover and are non-intercepting.

2. The dispenser system of claim 1 further comprises a combination of values and inlet tubes, each combination of values and inlet tube provide said precursor to a cavity of said showerhead.

3. The dispenser system of claim 1 further comprising a substrate heater located beneath said substrate.

4. The dispenser system of claim 1 wherein said nozzles total up to 36.

5. The dispenser system of claim 2 wherein said combination of values and inlet tubes total up to four.

6. The dispenser system of claim 1 wherein an end of said atomic source is positioned from about 20 to about 40 cm from said substrate.

7. The dispenser system of claim 1 wherein said precursor is an organometallic compound and said atom source generates N atoms.

8. A dispenser system for use in atomic beam assisted metal organic chemical vapor deposition comprising:
    an atomic source having an unimpeded line of site to a substrate, said atomic source generates reactive nitrogen atoms; and
    an annular metal organic chemical vapor deposition showerhead having a plurality of nozzles for delivering an organo aluminum precursor to the substrate, wherein each of said nozzles is angled to provide precursor beam trajectories that crossover and are non-intercepting.

9. The dispenser system of claim 8 further comprises a combination of values and inlet tubes, each combination of values and inlet tube provide said precursor to a cavity of said showerhead.

10. The dispenser system of claim 8 further comprising a substrate heater located beneath said substrate.

11. The dispenser system of claim 8 wherein said nozzles total up to 36.

12. The dispenser system of claim 9 wherein said combination of values and inlet tubes total up to four.

13. The dispenser system of claim 8 wherein an end of said atomic source is positioned from about 20 to about 40 cm from said substrate.

14. A method of depositing an ultra-thin film on a surface of a substrate comprising:
    providing a substrate to a vacuum enclosure of an atomic beam assisted metal organic CVD apparatus, said apparatus further including an atomic source having an unimpeded line of site to a substrate and an annular metal organic chemical vapor deposition showerhead having a plurality of nozzles for delivering a precursor to the substrate, wherein each of said nozzles is angled to provide precursor beam trajectories that crossover and are non-intercepting; and
    depositing an ultra-thin film on a surface of a substrate from said precursor and highly reactive atoms generated from said atomic source.

15. The method of claim 14 wherein said dispenser system further comprises a combination of values and inlet tubes, each combination of values and inlet tube provide said precursor to a cavity of said showerhead.

16. The method of claim 14 wherein said dispenser system further comprises a substrate heater located beneath said substrate.

17. The method of claim 14 wherein said nozzles total up to 36.

18. The method of claim 15 wherein said combination of values and inlet tubes total up to four.

19. The method of claim 14 wherein an end of said atomic source is positioned from about 20 to about 40 cm from said substrate.

20. The method of claim 14 wherein said precursor is an organometallic compound and said atom source generates N atoms.

* * * * *